United States Patent
Matsuhira et al.

(12) 
(10) Patent No.: US 6,528,889 B1
(45) Date of Patent: Mar. 4, 2003

(54) ELECTRONIC CIRCUIT DEVICE HAVING ADHESION-REINFORCING PATTERN ON A CIRCUIT BOARD FOR FLIP-CHIP MOUNTING AN IC CHIP

(75) Inventors: Tsutomu Matsuhira, Chiba (JP); Atsushi Endo, Chiba (JP)

(73) Assignee: Seiko Instruments Inc. (JP)

(*) Notice: Subject to any disclaimer, the term of this patent is extended or adjusted under 35 U.S.C. 154(b) by 0 days.

(21) Appl. No.: 09/342,424

(22) Filed: Jun. 29, 1999

(30) Foreign Application Priority Data

Jun. 30, 1998 (JP) ............................. 10/185058

(51) Int. Cl.[7] .............................................. H01L 23/12
(52) U.S. Cl. ....................... 257/778; 257/783; 174/260; 361/777; 361/779; 361/783
(58) Field of Search ................. 361/760, 767, 361/768, 771, 777, 779, 783; 174/250, 256, 257, 260, 259; 257/737, 738, 778, 779, 783; 438/108, 118, 119; 228/180.22; 29/832, 840

(56) References Cited

U.S. PATENT DOCUMENTS

| | | | | |
|---|---|---|---|---|
| 3,871,015 A | * | 3/1975 | Lin et al. ..................... | 257/778 |
| 5,400,950 A | * | 3/1995 | Myers et al. ........... | 228/180.22 |
| 5,448,114 A | * | 9/1995 | Kondoh et al. ............. | 257/778 |
| RE35,119 E | * | 12/1995 | Blonder et al. ............. | 361/767 |
| 5,677,575 A | * | 10/1997 | Maeta et al. ................ | 257/778 |
| 5,686,763 A | | 11/1997 | Tokuno et al. .............. | 257/777 |
| 5,804,882 A | * | 9/1998 | Tsukagoshi et al. ........ | 257/737 |
| 5,953,814 A | * | 9/1999 | Sozansky et al. ........... | 438/108 |
| 6,111,322 A | * | 8/2000 | Ando et al. ................. | 257/778 |
| 6,113,728 A | * | 9/2000 | Tsukagoshi et al. .......... | 29/832 |
| 6,121,062 A | * | 9/2000 | Karasawa et al. ..... | 228/180.22 |

FOREIGN PATENT DOCUMENTS

| | | |
|---|---|---|
| JP | 57176738 | 10/1982 |
| JP | 02185050 | 7/1990 |
| JP | 03079063 | 4/1991 |
| JP | 04171951 | 6/1992 |
| JP | 10144727 | 5/1998 |
| JP | 10163608 | 6/1998 |

OTHER PUBLICATIONS

Electronic Materials & Processes Handbook, 2nd edition, eds. Harper and Sampson, publ. McGraw–Hill, Inc. 1994, section 10.3.4, pp. 10.28–10.32.*

* cited by examiner

Primary Examiner—David L. Talbott
Assistant Examiner—John B. Vigushin
(74) Attorney, Agent, or Firm—Adams & Wilks

(57) ABSTRACT

An electronic circuit device has an insulating substrate and an integrated circuit having a surface disposed opposite to and confronting a surface of the insulating substrate to form a gap therebetween. An adhesive material is disposed in the gap between the insulating substrate and the integrated circuit. Bumps project from the surface of the integrated circuit towards the surface of the insulating substrate. Electrode patterns are electrically connected to the bumps to electrically connect the integrated circuit to the electrode patterns. An adhesion-reinforcing pattern is spaced-apart from and surrounded by the electrode patterns. The adhesion-reinforcing pattern is disposed on a portion of the surface of the insulating substrate confronting a portion of the surface of the integrated circuit from which the bumps do not project.

16 Claims, 4 Drawing Sheets

ELECTRONIC CIRCUIT DEVICE HAVING ADHESION-REINFORCING PATTERN ON A CIRCUIT BOARD FOR FLIP-CHIP MOUNTING AN IC CHIP

BACKGROUND OF THE INVENTION

1. Field of the Invention

The present invention relates to an electronic circuit device in which a driver IC, a memory, a controller and the like for driving a liquid crystal used in portable equipment, etc. and electronic pocketbooks are mounted in bare chips, or unpackaged.

2. Description of the Related Art

To join a semiconductor device to a circuit board by adhesion, the following conventional bare chip mounting techniques are available for semiconductor ICs. One technique involves the step of compression-bonding with an anisotropic conductive film to the circuit board using plated projecting electrodes of bumps, which are Au bumps formed on the IC pad by plating, or using stud bumps which are developed by wire bonding technology. Another technique involves the steps of transferring a silver paste onto the bumps for joining to the board and causing an underfill to fill up the space therebetween.

To join a semiconductor device to a circuit board by metal diffusion, the following conventional techniques are available. One technique involves the steps of preparing bumps made of a solder on an IC, soldering the bumps to the electrode of a board, and causing an underfill to fill up the space therebetween. Another technique involves the steps of preparing Au bumps on an IC, plating the electrode of a board with Sn, joining the IC to the board by the diffusion of Au and Sn, and causing an underfill to fill up the space therebetween.

FIG. 4 is a sectional view of a related art showing an electric circuit device. The device has a pattern 2 for electrically connecting an integrated circuit 4 to a peripheral circuit on an insulating substrate 1. The space between the lower surface of the integrated circuit 4 and the insulation substrate 1 is filled with an anisotropic conductive film 5.

SUMMARY OF THE INVENTION

In any joining technique, the joint reliability of a semiconductor IC requires that the underfill or a binder of the anisotropic conductive film have certain properties. In order for the underfill or the binder of the anisotropic conductive film to have a long-term reliability that may be impaired due to differences in the coefficient of linear expansion between the IC and the circuit board, such properties as the holding force at the time of curing, coefficient of linear expansion, and Young's modulus are important.

However, there is a mechanism which breaks the joint between the IC and the circuit board. That is, the joint is severed as the underfill or the binder of the anisotropic conductive film is peeled off from an area of the insulating substrate which is closer to the center than the bumps of the mounted IC. Particularly, in the case of COF in which a semiconductor IC is mounted on a film substrate that is formed by evaporating and plating Cu on a polyimide film, the adhesion of the IC to the polyimide film is so poor that no improvement in reliability has been made.

An object of the present invention is to overcome this problem.

To overcome this problem, in an electronic circuit device wherein an IC is mounted facedown at least on a circuit board, the IC is connected to the circuit board by reinforcing the adhesion of a circuit surface of the IC to the circuit board while causing an underfill made of an adhesive or causing a binder in the case of an anisotropic conductive film to fill up an area excluding an electrode connecting portion.

Here the circuit board has a pattern formed for connecting the board to the IC, and also has another pattern that is formed to connect to a dummy or part of electrical signal terminals adjacent to that pattern. Thus, the area where the IC adheres to the insulating substrate made of polyimide or the like is reduced and the area where the IC adheres to the pattern having a greater adhesive strength than polyimide is increased, and thus the reliability is improved.

The electronic circuit device that is constructed as described above provides an improved reliability against thermal stresses between the board and the IC caused by temperature fluctuations or the like. As a result, an electronic circuit device having a stable quality can be obtained.

DESCRIPTION OF THE PREFERRED EMBODIMENTS

Description of embodiment modes of the present invention will be made in conjunction with embodiments described below.

First Embodiment

Embodiments of the present invention will hereunder be described on the basis of the drawings.

Figure 1:
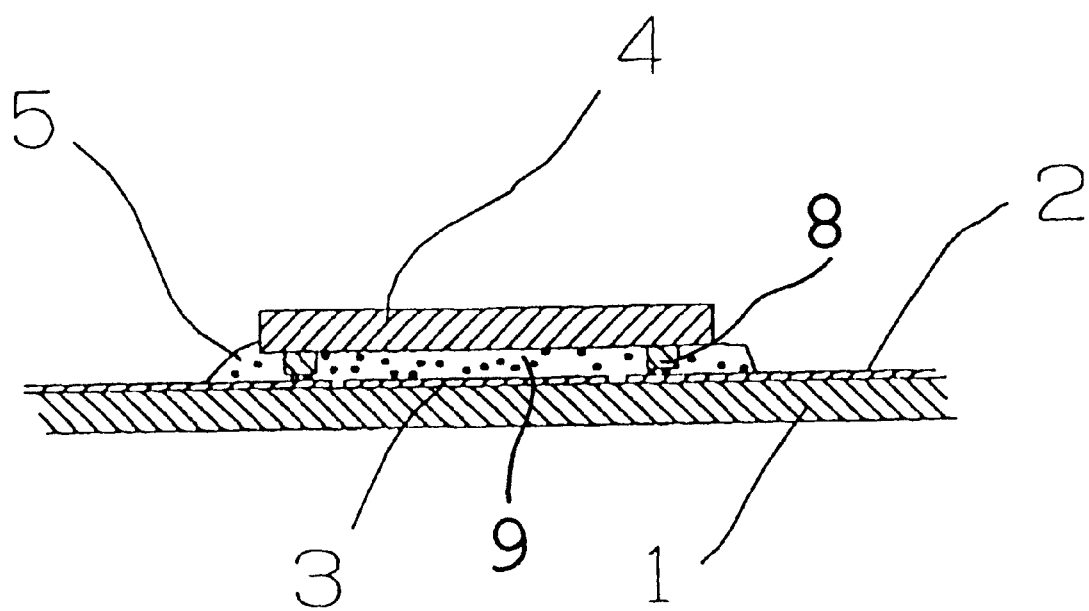
FIG. 1 is a sectional view of a mounting portion of a first embodiment according to the present invention.

FIG. 1 is a sectional view of an electronic circuit device according to a first embodiment of the present invention.

Figure 2:
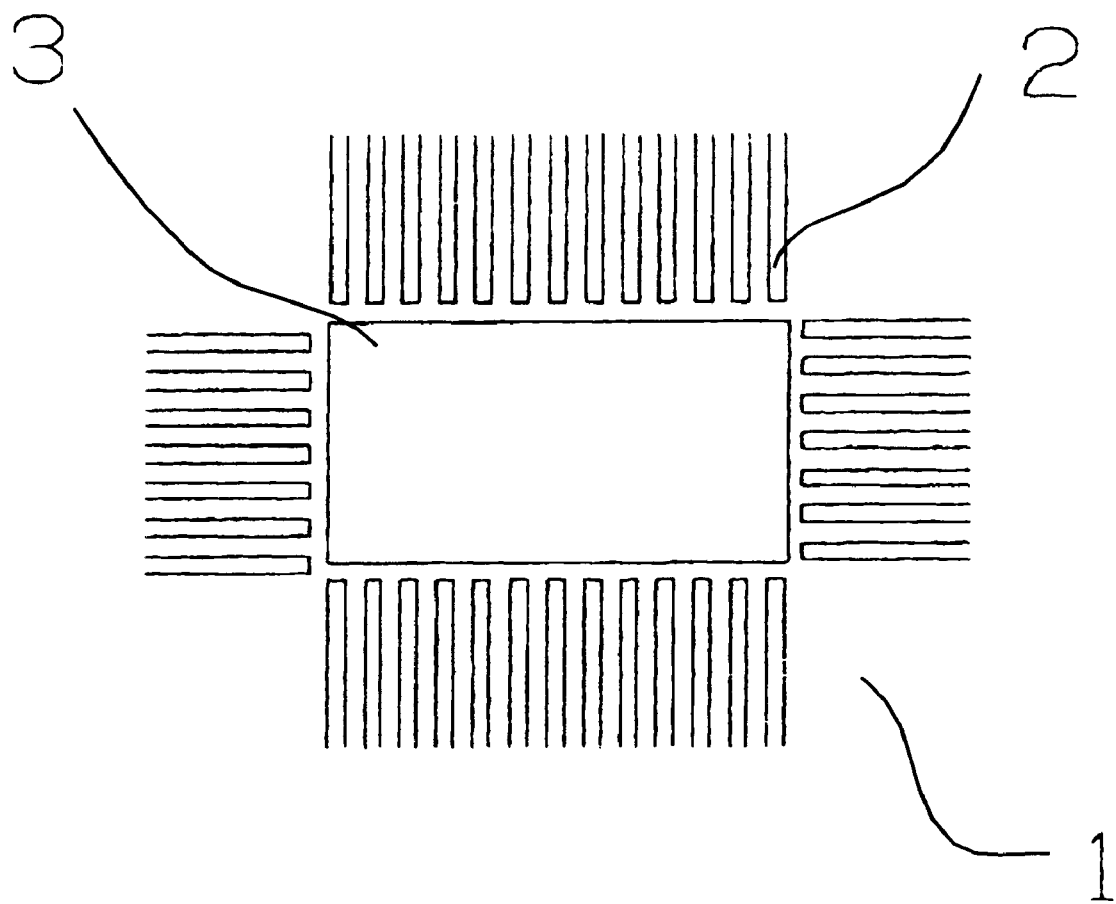
FIG. 2 is a top view showing a pattern on a film substrate of the first embodiment according to the present invention.

The electronic circuit device includes a circuit board having a pattern 2 comprised of a plurality of electrode patterns and disposed on a 25 $\mu$m polyimide insulating substrate 1. The pattern 2 is formed by electroless-plating an 8 $\mu$m layer of Cu with nickel and further subjecting the resultant pattern to a substitution plating process with gold. The circuit board also has an adhesion-reinforcing pattern 3 for improving its reliability. As shown in FIG. 1, the adhesion-reinforcing pattern has the same thickness as the pattern 2. The electronic circuit device has the mounting structure in which an IC 4 having plated projecting electrodes or bumps 8 is joined to the circuit board by thermocompression bonding using an anisotropic conductive film 5 having electroconductive particles 9. The joint pitch is 70 $\mu$m. The adhesion-reinforcing pattern 3 is arranged so as to be spaced apart from the pattern 2 connected to the IC by spaces of 100 $\mu$m totally. In this embodiment, as shown in FIG. 2, the pattern 2 is formed around a periphery of the adhesion-reinforcing pattern 3.

As a result of this structure, the area where the binder of the anisotropic conductive film adheres to the insulating substrate can be greatly reduced. This structure, because of its including the adhesion-reinforcing pattern, leads to an increase in the coefficient of linear expansion of the circuit board to $9.9\times10^{-6}$ from $7.2\times10^{-6}$ that is observed in the case of a circuit board only with polyimide and without an adhesion-reinforcing pattern. However, the presence of the adhesion-reinforcing pattern in this structure has contributed to significantly improving the adhesion of the IC to the board, and thus the reliability of the device has been improved.

A greater adhesive strength can be obtained by using Sn instead of Au in plating the circuit board. The pattern 3 may not necessarily be a continuous one, but may be arranged as divided or in the form of stripes.

Second Embodiment

Figure 3:
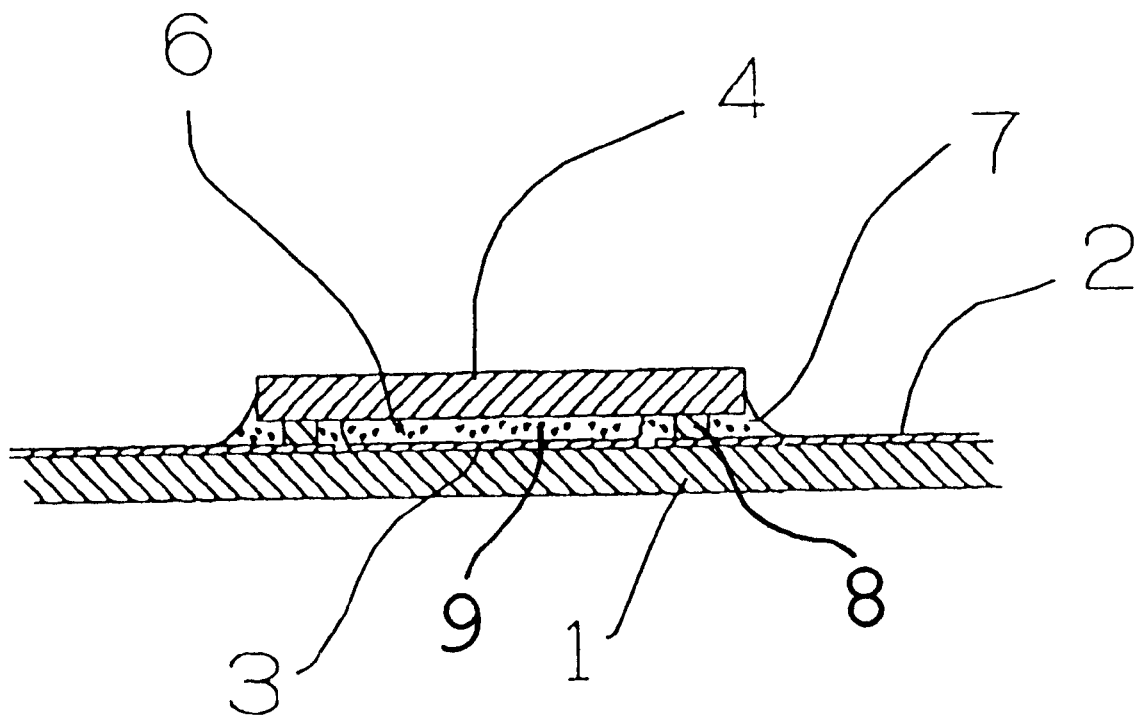
FIG. 3 is a sectional view of a mounting portion of a second embodiment according to the present invention.
Figure 4:
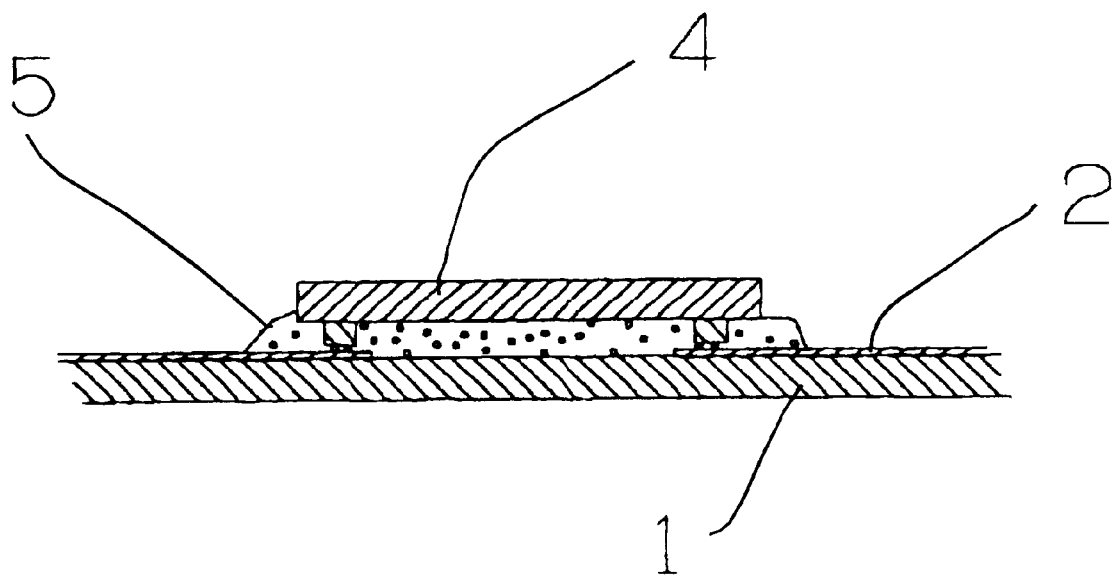
FIG. 4 is a sectional view of a mounting portion of a conventional example.

FIG. 3 is a sectional view of an electronic circuit device according to a second embodiment of the present invention. The electronic circuit device comprises a pattern 2 comprised of a plurality of electrode patterns formed by electroless-plating an 8 $\mu$m layer of Cu with Sn on a 25 $\mu$m polyimide insulating substrate 1. The circuit board has an adhesion-reinforcing pattern 3 on the insulating substrate 1 having the same thickness as and spaced apart from the pattern 2. An IC 4 having plated projecting electrodes or bumps 8 is joined to the circuit board by thermocompression bonding using the Au—Sn joint technique.

The joint process involves the steps of applying a first underfill 6 that can fill up almost all the area of the pattern 3, and then positioning the IC 4 and temporarily placing the IC 4 as positioned. At this time, the first underfill 6 can fill up the space between the pattern 3 and the IC 4.

Then, the circuit board is caused to adhere to the IC 4 by thermocompression bonding at the temperature and pressure required for performing the Au—Sn joint process. The first underfill 6 cures simultaneously with the bonding. The first underfill 6 has a greater adhesive strength to the Sn plated layer than to polyimide.

Further, to protect the periphery of the bumps, an ultraviolet-curable second underfill 7 is applied around the periphery of the bumps and cured with ultraviolet rays. The second underfill 7 cures basically with ultraviolet rays. However, by using an adhesive having the property of curing with the absence of oxygen as a catalyst, a portion of the second underfill which is not exposed to the ultraviolet rays is allowed to cure in the end.

Either an adhesive having the property of curing with the absence of oxygen as a catalyst or a thermosetting adhesive may be used as the first underfill.

The process for causing the underfills to fill up the space is not necessarily carried out in two steps. The second underfill may be applied to the side surfaces of the IC after the joint, then spread out by capillarity and cured.

As described in the foregoing, the present invention allows the joint reliability of an IC to be improved by arranging an adhesion-reinforcing pattern even if an adhesive, through which an underfill or the binder of an anisotropic conductive film adheres to the insulating substrate, has a small adhesive strength. In addition, in the case of COF, although polyimide has a poor moisture resistance, the adhesion-reinforcing pattern serves as a moisture-resistant barrier, and thus the reliability can be further improved. Moreover, in the case of an anisotropic conductive film, the bumps of an IC are joined to the pattern of a circuit board with particles. However, the binder is required to have a holding force for holding these particles. This holding force is reduced when the binder loosens due to a temperature change. How the binder loosens depends on the coefficient of linear expansion. Since the pattern of the present invention can reduce the thickness of the binder layer, how much the binder loosens is reduced, and thus the reliability can be further improved.

What is claimed is:

1. An electronic circuit device comprising:

an insulating substrate;

an integrated circuit having a surface disposed opposite to and confronting a surface of the insulating substrate to form a gap therebetween;

an adhesive material disposed in the gap between the insulating substrate and the integrated circuit;

a plurality of bumps projecting from the surface of the integrated circuit towards the surface of the insulating substrate;

a plurality of electrode patterns electrically connected to the bumps to electrically connect the integrated circuit to the electrode patterns; and an adhesion-reinforcing pattern disposed on a portion of the surface of the insulating substrate confronting a portion of the surface of the integrated circuit from which the bumps and any other adhesion-reinforcing pattern do not project, the adhesion-reinforcing pattern being spaced apart from and surrounded by the electrode patterns, a distance between the adhesion-reinforcing pattern and each of the electrode patterns being 100 $\mu$m.

2. An electronic circuit device according to claim 1; wherein the insulating substrate comprises a polyimide insulating substrate.

3. An electronic circuit device according to claim 1; wherein the insulating substrate has a thickness of 25 $\mu$m; and wherein each of the electrode patterns and the adhesion-reinforcing pattern has a thickness of 8 $\mu$m.

4. An electronic circuit device according to claim 3; wherein the insulating substrate comprises a polyimide insulating substrate.

5. An electronic circuit device according to claim 1; wherein the electrode patterns and the adhesion-reinforcing pattern have the same thickness.

6. An electronic circuit device comprising:

an insulating substrate;

an integrated circuit having a surface disposed opposite to and confronting a surface of the insulating substrate to form a gap therebetween;

an adhesive material disposed in the gap between the insulating substrate and the integrated circuit;

a plurality of bumps each having a preselected height, a first surface and a second surface, the first surface being connected to the surface of the integrated circuit so that the bumps project from the surface of the integrated circuit towards the surface of the insulating substrate;

a plurality of electrode patterns each having a first surface disposed in contact with the surface of the insulating substrate and a second surface opposite the first surface thereof and disposed in contact with the second surface of at least one of the bumps to electrically connect the integrated circuit to the electrode patterns; and an adhesion-reinforcing pattern spaced apart from and surrounded by the electrode patterns, a distance between the adhesion-reinforcing pattern and each of the electrode patterns being 100 $\mu$m, the adhesion-reinforcing pattern having a first surface disposed in contact with the surface of the insulating substrate and a second surface opposite the first surface thereof and confronting a portion of the surface of the integrated circuit from which the bumps and any other adhesion-reinforcing pattern do not project, a distance between the second surface of the adhesion-reinforcing pattern and the surface of the integrated circuit being substantially equal to the preselected height of the bumps.

7. An electronic circuit device according to claim 6; wherein the insulating substrate comprises a polyimide insulating substrate.

8. An electronic circuit device according to claim 6; wherein the insulating substrate has a thickness of 25 $\mu$m; and wherein each of the electrode patterns and the adhesion-reinforcing pattern has a thickness of 8 $\mu$m.

9. An electronic circuit device according to claim 8; wherein the insulating substrate comprises a polyimide insulating substrate.

10. An electronic circuit device according to claim 6; wherein the electrode patterns and the adhesion-reinforcing pattern have the same thickness.

11. An electronic circuit device comprising:

an insulating substrate;

an integrated circuit having a surface disposed opposite to and confronting a surface of the insulating substrate to form a gap therebetween;

an adhesive material disposed in the gap between the insulating substrate and the integrated circuit, the adhesive material containing electroconductive particles each having a preselected height;

a plurality of bumps each having a preselected height, a first surface and a second surface, the first surface being connected to the surface of the integrated circuit so that the bumps project from the surface of the integrated circuit towards the surface of the insulating substrate;

a plurality of electrode patterns each having a first surface disposed in contact with the surface of the insulating substrate and a second surface opposite the first surface thereof and disposed in contact with the second surface of at least one of the bumps through an electroconductive particle of the adhesive material disposed between the second surface of the electrode pattern and the second surface of the bump;

an adhesion-reinforcing pattern spaced apart from and surrounded by the electrode patterns, the adhesion-reinforcing pattern having a first surface disposed in contact with the surface of the insulating substrate and a second surface opposite the first surface thereof and confronting a portion of the surface of the integrated circuit from which the bumps and any other adhesion-reinforcing pattern do not project, a distance between the second surface of the adhesion-reinforcing pattern and the surface of the integrated circuit being substantially equal to the combined heights of one of the bumps and the electroconductive particle disposed between the second surface of the electrode pattern and the second surface of the bump.

12. An electronic circuit device according to claim 11; wherein the insulating substrate comprises a polyimide insulating substrate.

13. An electronic circuit device according to claim 11; wherein a distance between the adhesion-reinforcing pattern and each of the electrode patterns is 100 $\mu$m.

14. An electronic circuit device according to claim 11; wherein the insulating substrate has a thickness of 25 $\mu$m; and wherein each of the electrode patterns and the adhesion-reinforcing pattern has a thickness of 8 $\mu$m.

15. An electronic circuit device according to claim 14; wherein the insulating substrate comprises a polyimide insulating substrate.

16. An electronic circuit device according to claim 11; wherein the electrode patterns and the adhesion-reinforcing pattern have the same thickness.

* * * * *